US008921947B1

(12) United States Patent  
Hung et al.

(10) Patent No.: US 8,921,947 B1  
(45) Date of Patent: Dec. 30, 2014

(54) MULTI-METAL GATE SEMICONDUCTOR DEVICE HAVING TRIPLE DIAMETER METAL OPENING

(71) Applicant: United Microelectronics Corp., Hsinchu (TW)

(72) Inventors: Ching-Wen Hung, Tainan (TW); Chih-Sen Huang, Tainan (TW); Yi-Ching Wu, Kaohsiung (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 13/913,617

(22) Filed: Jun. 10, 2013

(51) Int. Cl.
| *H01L 29/76* | (2006.01) |
| *H01L 29/94* | (2006.01) |
| *H01L 31/062* | (2012.01) |
| *H01L 31/113* | (2006.01) |
| *H01L 31/119* | (2006.01) |
| *H01L 29/792* | (2006.01) |
| *H01L 27/10* | (2006.01) |
| *H01L 29/739* | (2006.01) |
| *H01L 21/768* | (2006.01) |
| *H01L 29/45* | (2006.01) |

(52) U.S. Cl.
CPC .......... *H01L 21/7688* (2013.01); *H01L 29/458* (2013.01)
USPC .......... 257/384; 257/202; 257/324; 257/390; 257/E29.275; 257/E29.319

(58) Field of Classification Search
USPC .................. 257/202, 324, 384, 390, E29.275, 257/E29.319
See application file for complete search history.

(56) References Cited

U.S. PATENT DOCUMENTS

| 5,095,345 | A | * | 3/1992 | Gill et al. ...................... 257/314 |
| 5,162,250 | A | * | 11/1992 | Clark ............................ 438/245 |
| 5,648,673 | A | * | 7/1997 | Yasuda ......................... 257/382 |
| 5,892,282 | A | | 4/1999 | Hong |
| 5,998,873 | A | | 12/1999 | Blair |
| 6,033,963 | A | | 3/2000 | Huang |
| 6,060,350 | A | * | 5/2000 | Iwasa ............................ 438/239 |
| 6,066,533 | A | | 5/2000 | Yu |
| 6,096,659 | A | | 8/2000 | Gardner |
| 6,150,689 | A | * | 11/2000 | Narui et al. ................... 257/306 |
| 6,177,303 | B1 | | 1/2001 | Schmitz |
| 6,303,418 | B1 | | 10/2001 | Cha |
| 6,458,684 | B1 | | 10/2002 | Guo |
| 6,492,217 | B1 | | 12/2002 | Bai |
| 6,552,377 | B1 | | 4/2003 | Yu |
| 6,573,134 | B2 | | 6/2003 | Ma |
| 6,653,698 | B2 | | 11/2003 | Lee |
| 6,696,345 | B2 | | 2/2004 | Chau |
| 6,790,719 | B1 | | 9/2004 | Adetutu |
| 6,794,234 | B2 | | 9/2004 | Polishchuk |

(Continued)

*Primary Examiner* — Ida M Soward  
(74) *Attorney, Agent, or Firm* — WPAT, PC; Justin King (57) ABSTRACT

A method for manufacturing a semiconductor device and a device manufactured using the same are provided. A substrate with plural metal gates formed thereon is provided, wherein the adjacent metal gates are separated by insulation. A sacrificial layer is formed for capping the metal gates and the insulation, and the sacrificial layer and the insulation are patterned to form at least an opening for exposing the substrate. A silicide is formed corresponding to the opening at the substrate, and a conductive contact is formed in the opening. The conductive contact has a top area with a second diameter CD2 for opening the insulation. A patterned dielectric layer, further formed on the metal gates, the insulation and the conductive contact, at least has a first M0 opening with a third diameter CD3 for exposing the conductive contact, wherein CD2>CD3.

8 Claims, 6 Drawing Sheets

(56) References Cited

U.S. PATENT DOCUMENTS

| Patent No. | Date | Inventor | Ref |
|---|---|---|---|
| 6,858,483 B2 | 2/2005 | Doczy | |
| 6,902,969 B2 | 6/2005 | Adetutu | |
| 6,921,711 B2 | 7/2005 | Cabral, Jr. | |
| 6,953,719 B2 | 10/2005 | Doczy | |
| 6,960,416 B2 | 11/2005 | Mui | |
| 6,967,131 B2 | 11/2005 | Saenger | |
| 6,972,225 B2 | 12/2005 | Doczy | |
| 7,029,966 B2 | 4/2006 | Amos | |
| 7,030,430 B2 | 4/2006 | Doczy | |
| 7,056,794 B2 | 6/2006 | Ku | |
| 7,064,050 B2 | 6/2006 | Cabral, Jr. | |
| 7,064,066 B1 | 6/2006 | Metz | |
| 7,074,664 B1 | 7/2006 | White | |
| 7,074,680 B2 | 7/2006 | Doczy | |
| 7,109,079 B2 | 9/2006 | Schaeffer, III | |
| 7,112,851 B2 | 9/2006 | Saenger | |
| 7,126,199 B2 | 10/2006 | Doczy | |
| 7,144,783 B2 | 12/2006 | Datta | |
| 7,148,548 B2 | 12/2006 | Doczy | |
| 7,153,734 B2 | 12/2006 | Brask | |
| 7,153,784 B2 | 12/2006 | Brask | |
| 7,157,378 B2 | 1/2007 | Brask | |
| 7,176,090 B2 | 2/2007 | Brask | |
| 7,183,184 B2 | 2/2007 | Doczy | |
| 7,186,605 B2 | 3/2007 | Cheng | |
| 7,193,893 B2 | 3/2007 | Forbes | |
| 7,208,361 B2 | 4/2007 | Shah | |
| 7,208,366 B2 | 4/2007 | Tsai | |
| 7,214,620 B2 | 5/2007 | Kim | |
| 7,217,611 B2 | 5/2007 | Kavalieros | |
| 7,220,635 B2 | 5/2007 | Brask | |
| 7,316,949 B2 | 1/2008 | Doczy | |
| 7,317,231 B2 | 1/2008 | Metz | |
| 7,326,610 B2 | 2/2008 | Amos | |
| 7,355,281 B2 | 4/2008 | Brask | |
| 7,381,619 B2 | 6/2008 | Wang | |
| 7,390,709 B2 | 6/2008 | Doczy | |
| 7,407,876 B2 | 8/2008 | Ishizaka | |
| 7,488,656 B2 | 2/2009 | Cartier | |
| 7,556,998 B2 | 7/2009 | Park | |
| 7,666,746 B2 | 2/2010 | Gambino | |
| 7,700,479 B2 | 4/2010 | Huang | |
| 7,768,074 B2 | 8/2010 | Golonzka | |
| 7,785,958 B2 | 8/2010 | Doczy | |
| 7,816,218 B2 | 10/2010 | Klaus | |
| 7,867,863 B2 | 1/2011 | Chang | |
| 8,035,165 B2 | 10/2011 | Yeh | |
| 8,048,790 B2 | 11/2011 | Soss | |
| 8,093,120 B2 | 1/2012 | Yeh | |
| 8,120,114 B2 | 2/2012 | Ott | |
| 8,202,776 B2 | 6/2012 | Chang | |
| 8,222,136 B2 | 7/2012 | Tu | |
| 8,232,148 B2 | 7/2012 | Li | |
| 8,536,656 B2 * | 9/2013 | Ramachandran et al. | 257/383 |
| 2002/0127888 A1 | 9/2002 | Cho | |
| 2005/0095763 A1 | 5/2005 | Samavedam | |
| 2005/0202659 A1 | 9/2005 | Li | |
| 2005/0275035 A1 | 12/2005 | Mathew | |
| 2006/0024953 A1 | 2/2006 | Papa Rao et al. | |
| 2006/0040482 A1 | 2/2006 | Yang | |
| 2006/0054943 A1 | 3/2006 | Li | |
| 2006/0192255 A1 * | 8/2006 | Kim et al. | 257/382 |
| 2007/0037335 A1 | 2/2007 | Chambers | |
| 2007/0082445 A1 | 4/2007 | Yang | |
| 2007/0138559 A1 | 6/2007 | Bohr | |
| 2007/0141798 A1 | 6/2007 | Bohr | |
| 2007/0145591 A1 | 6/2007 | Yano | |
| 2007/0148838 A1 | 6/2007 | Doris | |
| 2007/0210354 A1 | 9/2007 | Nabatame | |
| 2007/0259519 A1 | 11/2007 | Yang | |
| 2007/0262451 A1 | 11/2007 | Rachmady | |
| 2007/0272123 A1 | 11/2007 | Kennedy | |
| 2008/0057650 A1 * | 3/2008 | Uno et al. | 438/270 |
| 2008/0076216 A1 | 3/2008 | Pae | |
| 2008/0224235 A1 | 9/2008 | Lavoie | |
| 2008/0318371 A1 | 12/2008 | Lin | |
| 2009/0039433 A1 | 2/2009 | Yang | |
| 2009/0057769 A1 | 3/2009 | Wei | |
| 2009/0057787 A1 | 3/2009 | Matsuki | |
| 2009/0166769 A1 | 7/2009 | Metz | |
| 2009/0186458 A1 | 7/2009 | Yu | |
| 2010/0040768 A1 | 2/2010 | Dhindsa | |
| 2010/0044783 A1 | 2/2010 | Chuang | |
| 2010/0052066 A1 | 3/2010 | Yu | |
| 2010/0052074 A1 | 3/2010 | Lin | |
| 2010/0065926 A1 | 3/2010 | Yeh | |
| 2010/0068877 A1 | 3/2010 | Yeh | |
| 2010/0081262 A1 | 4/2010 | Lim | |
| 2010/0087055 A1 | 4/2010 | Lai | |
| 2010/0124818 A1 | 5/2010 | Lee | |
| 2010/0129974 A1 * | 5/2010 | Futase et al. | 438/303 |
| 2010/0133622 A1 * | 6/2010 | Iwamoto et al. | 257/369 |
| 2010/0163979 A1 * | 7/2010 | Hebert | 257/335 |
| 2010/0244141 A1 | 9/2010 | Beyer | |
| 2010/0283152 A1 | 11/2010 | Chen | |
| 2010/0314690 A1 * | 12/2010 | Chung et al. | 257/384 |
| 2011/0037105 A1 | 2/2011 | Chang | |
| 2011/0079827 A1 | 4/2011 | Ellis-Monaghan | |
| 2011/0129984 A1 * | 6/2011 | Funayama et al. | 438/424 |
| 2011/0210403 A1 | 9/2011 | Teo | |
| 2011/0260262 A1 * | 10/2011 | Yin et al. | 257/390 |
| 2012/0012936 A1 * | 1/2012 | Shinkawata | 257/368 |
| 2012/0032238 A1 | 2/2012 | Teo | |
| 2012/0034773 A1 | 2/2012 | Ott | |
| 2012/0068234 A1 | 3/2012 | Soss | |
| 2012/0139015 A1 | 6/2012 | Yu | |
| 2012/0139049 A1 | 6/2012 | Kanike | |
| 2012/0139061 A1 | 6/2012 | Ramachandran | |
| 2012/0153405 A1 * | 6/2012 | Heinrich et al. | 257/410 |
| 2012/0187420 A1 | 7/2012 | Li | |
| 2012/0187459 A1 | 7/2012 | Pan | |
| 2012/0187504 A1 * | 7/2012 | Igarashi et al. | 257/390 |
| 2012/0223394 A1 | 9/2012 | Toh | |
| 2012/0228679 A1 | 9/2012 | Chang | |
| 2013/0341695 A1 * | 12/2013 | Fazan | 257/296 |
| 2014/0106530 A1 * | 4/2014 | Funayama et al. | 438/287 |

\* cited by examiner

MULTI-METAL GATE SEMICONDUCTOR DEVICE HAVING TRIPLE DIAMETER METAL OPENING

BACKGROUND

1. Technical Field

The disclosure relates in general to a method for manufacturing a semiconductor device and device manufactured using the same, and more particularly to the method for manufacturing a semiconductor device with a sacrificial layer for silicide formation, thereby preventing possible damages to the metal gate due to the oxide loss in the subsequent procedures.

2. Description of the Related Art

Size of semiconductor device has been decreased for these years. Reduction of feature size, improvements of the rate, the efficiency, the density and the cost per integrated circuit unit are the important goals in the semiconductor technology. The electrical properties of the device have to be maintained even improved with the decrease of the size, to meet the requirements of the commercial products in applications. For example, the layers and components with damages, which have considerable effects on the electrical properties, would be one of the important issues of the device for the manufacturers.

SUMMARY

The disclosure is directed to a method for manufacturing a semiconductor device and device manufactured using the same, which a sacrificial layer is added before silicide formation, and possible damages to the metal gate due to the oxide loss in the subsequent patterning procedures would be effectively prevented, thereby improving the electrical properties of the device.

According to the disclosure, a method for manufacturing a semiconductor device is provided. A substrate with plural metal gates formed thereon is provided, wherein the adjacent metal gates are separated by insulation. A sacrificial layer is formed for capping the metal gates and the insulation, and the sacrificial layer and the insulation are patterned to form at least an opening for exposing the substrate. A silicide is formed corresponding to the opening at the substrate, and a conductive contact is formed in the opening.

According to the disclosure, a semiconductor device is provided, comprising a substrate with a gate layer formed thereon and silicides formed therein, and the gate layer comprising plural metal gates separated by an insulation, said silicides positioned between the metal gates; at least a conductive contact formed in the insulation between adjacent metal gates for electrically connecting the silicide; and a patterned dielectric layer formed on the metal gates, the insulation and the conductive contact, and the patterned dielectric layer at least having a first metal-0 (M0) opening exposing the conductive contact. The conductive contact has a bottom area with a first diameter (CD1) for electrically connecting the silicide, and has a top area with a second diameter (CD2) for opening the insulation. Also, the first M0 opening has a bottom area with a third diameter (CD3) for exposing the conductive contact. The third diameter (CD3) is smaller than the second diameter (CD2).

DETAILED DESCRIPTION

In the present disclosure, a method for manufacturing a semiconductor device is provided to effectively prevent the possible damages to the components (such as metal gate, etch stop layer . . . etc.), and the electrical properties of the device manufactured using the method of the present disclosure could be greatly improved. The embodiments are described in details with reference to the accompanying drawings. The identical and/or similar elements of the embodiments are designated with the same and/or similar reference numerals. Also, it is also important to point out that the illustrations may not be necessarily be drawn to scale, and that there may be other embodiments of the present disclosure which are not specifically illustrated. Thus, the specification and the drawings are to be regard as an illustrative sense rather than a restrictive sense.

In the present disclosure, a sacrificial layer is added before silicide formation, and the method for manufacturing a semiconductor device would be slightly different, and could be modified and changed according to the selected material of the silicide and the patterning procedures in practical applications. Two different materials of silicides are taken for describing the embodiments, but the present disclosure is not limited thereto.

First Embodiment

Figure 1A:
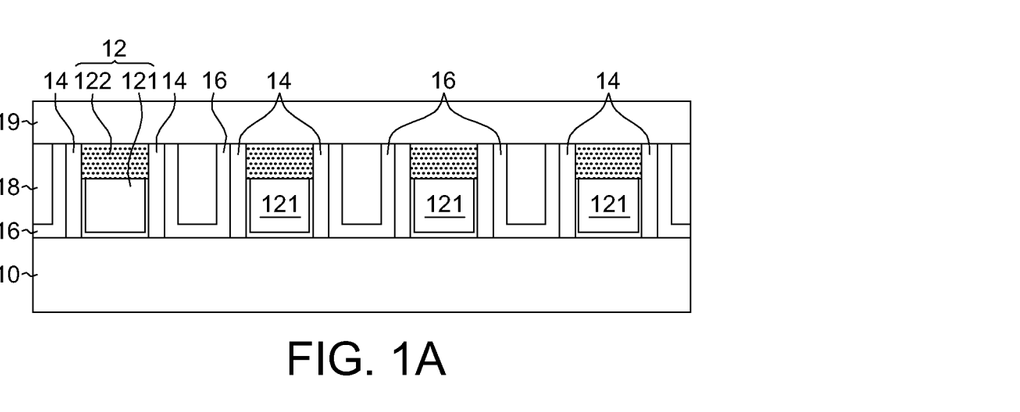
FIG. 1A~FIG. 1H illustrate a method for manufacturing a semiconductor device according to a first embodiment of the present disclosure.

FIG. 1A~FIG. 1H illustrate a method for manufacturing a semiconductor device according to a first embodiment of the present disclosure. First, a substrate 10 having plural gate structures such as metal gates 12 formed thereon is provided, wherein the adjacent metal gates 12 are separated by an insulation, as shown in FIG. 1A. In one embodiment, a RMG (replacement metal gate) process would have been done, and a metal portion 121 and a hard mask layer 122 on the metal portion 121 constitute a metal gate 12 of the device. Also, two spacers 14 are formed at the sidewalls of the metal gate 12, and a contact etch stop layer (CESL) 16 is formed on the substrate 10 as an U-shape between the spacers 14. An interlayer dielectric (ILD) layer 18 fills into the space of the U-shaped CESL 16. Accordingly, the insulation for separating the adjacent metal gates 12 comprises the spacers 14, the CESL 16 and the ILD layer 18, as shown in FIG. 1A.

In one embodiment, the substrate 10 could be a silicon substrate, the spacers 14 and the CESL 16 could be made of the same material such as SICN, formed by atomic layer deposition (ALD). Also, the hard mask layer 122 could be made of nitrite or oxide; for example, the hard mask layer 122 is made of silicon nitride (SIN). Also, the spacers 14 could be one layer or multi-layer, which are not limited particularly.

Figure 1B:
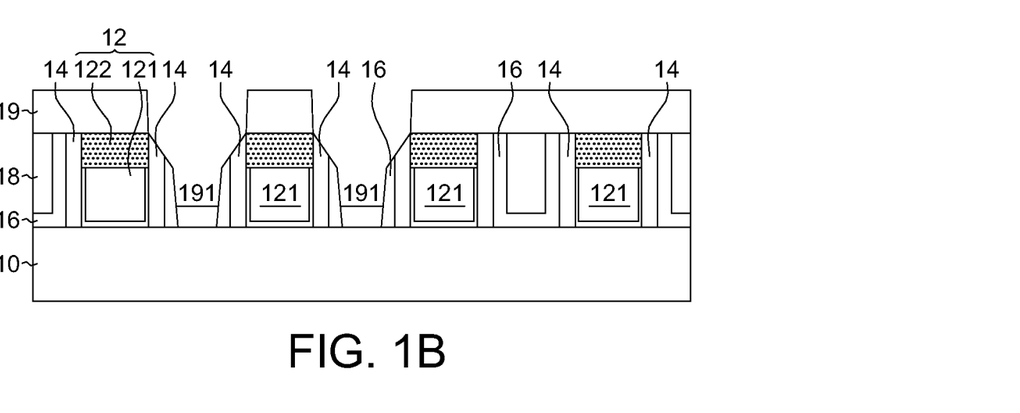

Afterward, a sacrificial layer 19 is formed for capping the metal gates 12 and the insulation (including the spacers 14, the CESL 16 and the ILD layer 18), and the sacrificial layer 19 and the insulation are patterned to form at least an opening 191 for exposing the substrate 10, as shown in FIG. 1B. Two openings 191 are illustrated in the drawings, but the number of the openings 191 would be determined depending on the actual needs of the practical applications. In one embodiment, each opening 191 could be formed by lithography and etching procedures, and the ILD layer 18, parts of the CESL 16 and the spacers 14 are removed. In the etching procedure, top rounding is performed, and the top of the opening 191 is wider than the bottom of the opening 191, as shown in FIG. 1B. In one embodiment, a thickness of the sacrificial layer 19 is in a range of about 300 Å about 500 Å, such as about 400 Å, but those values are not for limiting the scope of the disclosure.

The material of the sacrificial layer 19 is different from that of the hard mask layer 122. In one embodiment, the sacrificial layer 19 is (but not limited to) made of SiON, SiCN, or oxides.

Also, after forming the openings 191, the substrate 10 and the openings 191 could be subjected to a treatment, such as a SiCoNi pre-clean treatment or an Ar pre-clean treatment, to clean the impurities (ex: native oxides).

Figure 1C:
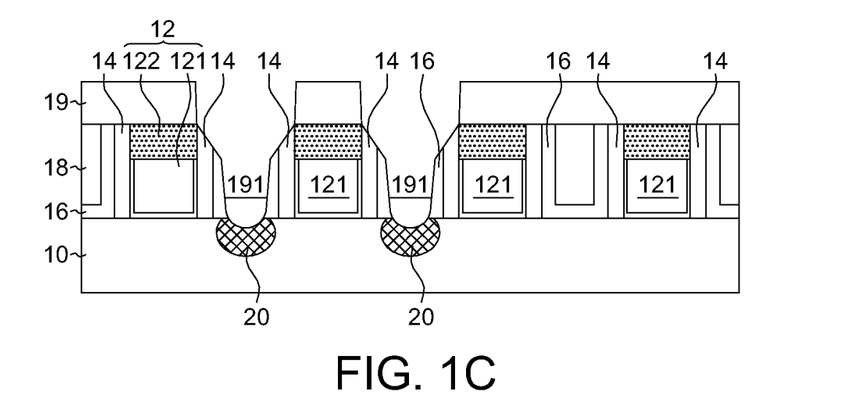
Figure 1D:
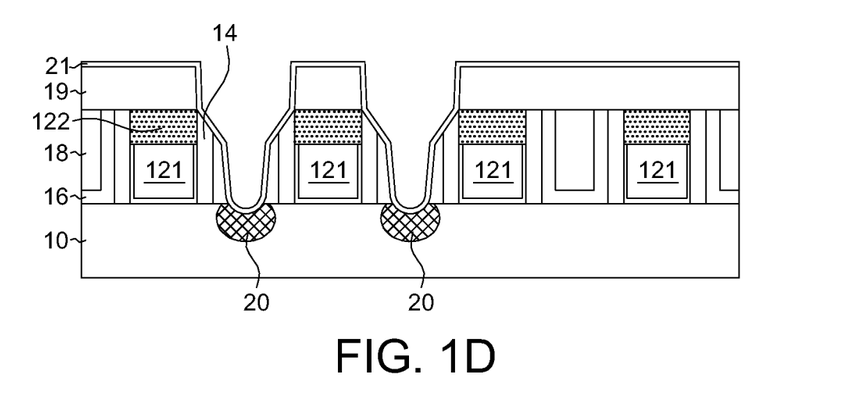
Figure 1E:
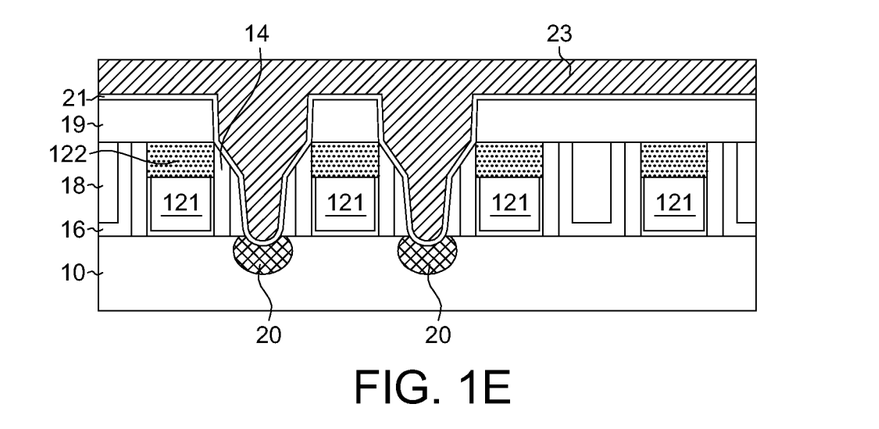

A silicide is then formed corresponding to the opening 191 at the substrate 10, as shown in FIG. 1C. The silicide may be NiSi, TiSi or cold Ti, which is not limited particularly. NiSi 20 is taken for exemplifying the silicide of the first embodiment. In the step of forming the NiSi 20, a Ni containing layer (such as NiPt) is deposited at the substrate 10 within the openings 191, and then subjected to a thermal treatment to form a Ni containing portion such as the NiSi 20 at the substrate 10. Then, the unreacted Ni containing portion is removed, such as by wet etching using suitable chemical agents/solution. The NiSi 20 has a surface concave to the substrate 10 as depicted in FIG. 1C.

In the first embodiment, the thermal treatment could be a rapid thermal process (RTP), which is performed to make a portion of the Ni containing layer (such as NiPt) react with the substrate 10 (such as the silicon substrate) to form a Ni containing portion such as the NiSi 20. The rapid thermal process could be conducted at the temperature sufficient to conduct the Ni-silicide formation.

Figure 1F:
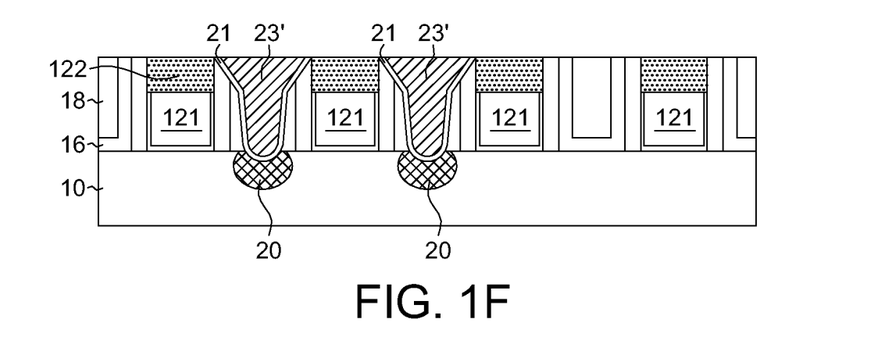

After formation of silicide, a conductive contact 23' is further formed in the opening 191 (FIG. 1F). In the first embodiment, formation of the conductive contact 23' could be implemented by depositing a first barrier metal 21 in the opening 191 as a liner (FIG. 1D), depositing a conductive material 23 on the substrate 10 and filling the opening 191 (FIG. 1E), and planarizing the conductive material 23 to expose the metal gate 12 (FIG. 1F). In the first embodiment, the NiSi 20 and the conductive contact 23' are separated by the first barrier metal 21.

In the first embodiment with the formation of NiSi 20, the first barrier metal 21 could be Ti/TiN (Ti improving adhesion between TiN and dielectric) or other suitable materials. The conductive material 23 could be tungsten (W), and planarized by chemical-mechanical polishing (CMP) or other suitable planarization methods to expose the metal gate 12. As shown in FIG. 1F, the hard mask layer 122 of the metal gate 12 is exposed after planarization of the conductive material 23. The sacrificial layer 19 could be also removed during planarization.

In the embodiment, the thickness of the sacrificial layer 19 could be determined by evaluating the insulation and hard mask layer 122 loss in sum in the subsequent procedures, such as insulation and hard mask layer 122 loss in the open-forming step, the pre-clean step (SiCoNi pre-clean or Ar pre-clean) and tungsten (W)-planarizing step.

Figure 1G:
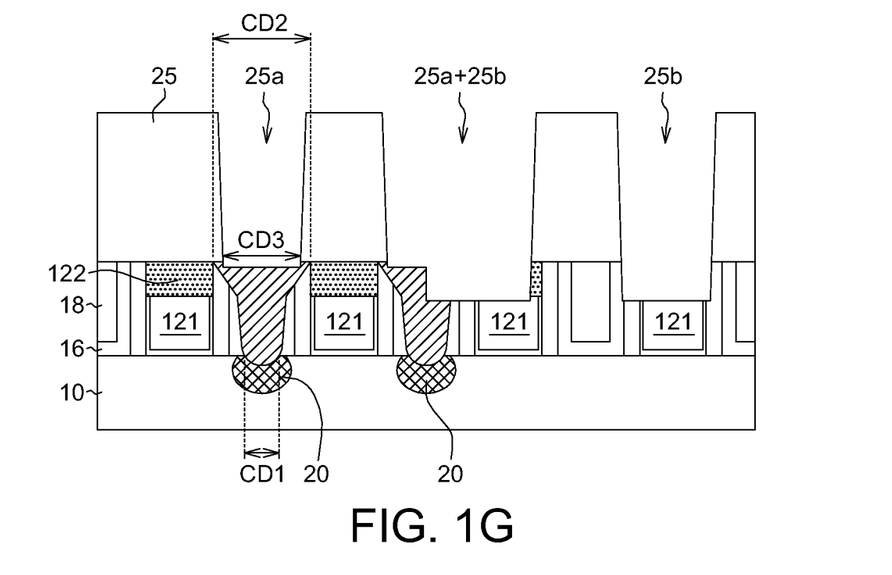

After formation of the conductive contact 23' in the opening 191, a dielectric layer 25 such as a post-metal dielectric (PMD) is formed on the metal gates 12, the insulation and the conductive contact 23', followed by patterning. After patterning the dielectric layer 25, at least a first metal-0 (M0) opening 25a and a second M0 opening 25b are formed for respectively exposing the conductive contact 23' and the metal gate 12. As shown in FIG. 1G, patterning procedures (such as lithography and etching) for forming the first M0 opening 25a and the second M0 opening 25b could be performed according to the designs and pattern requirements of the practical application, and the overlapping area(s) denoted as 25a+25b could be created. In the practical application, the first M0 opening 25a could be the M0 S/D contact hole, and the second M0 opening 25b could be the M0 gate contact hole. Furthermore, formation of the M0 openings 25a could be performed before or after that of the second M0 opening 25b, which is not limited particularly.

Figure 1H:
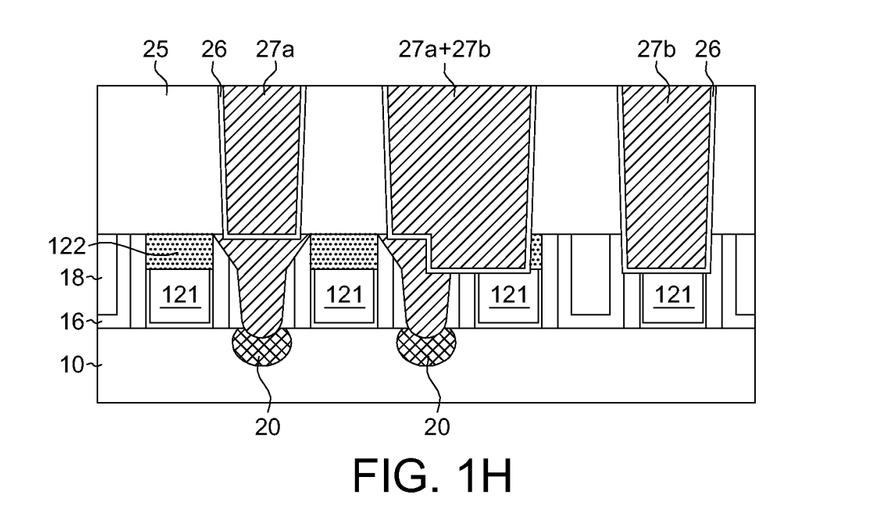

Afterwards, steps of deposition of a barrier metal layer 26 (such as Ti/TiN), deposition of a conductive material (such as W) for filling the first M0 opening 25a and the second M0 opening 25b, followed by planarizing the conductive material are performed to respectively form a first M0 contact 27a and a second M0 contact 27b in the first M0 opening 25a and the second M0 opening 25b, as shown in FIG. 1H. In the practical application, the first M0 contact 27a could be a conductive M0 S/D contact, and the second M0 contact 27b could be a conductive M0 gate contact.

Please refer to FIG. 1B and FIG. 1G. The opening 191 has a bottom area with a first diameter (denoted as CD1) for exposing the substrate 10, and has a top area with a second diameter (denoted as CD2) for opening the insulation. In one embodiment, the top area of the opening 191 having the second diameter CD2 exposes the CESL 16. Also, the first M0 opening 25a has a bottom area with a third diameter (denoted as CD3) for exposing the conductive contact 23'. According to the method of manufacturing the device of the embodiment, the second diameter CD2 would be larger than the first diameter CD1, and the third diameter CD3 would be smaller than the second diameter CD2. This structural feature could be easily identified by the microscopic examination.

In one embodiment, the diameter CD1 is in a range from 20 nm to 40 nm, the diameter of CD2 is in a range from 50 nm to 80 nm, and the diameter of CD3 is in a range from 30 nm to 50 nm. However, it is known that the diameter of CD1/CD2/CD3 would be determined according to structural design and device requirements of the practical application, and/or processing ability, and could be modified and changed depending on different conditions.

Figure 2A:
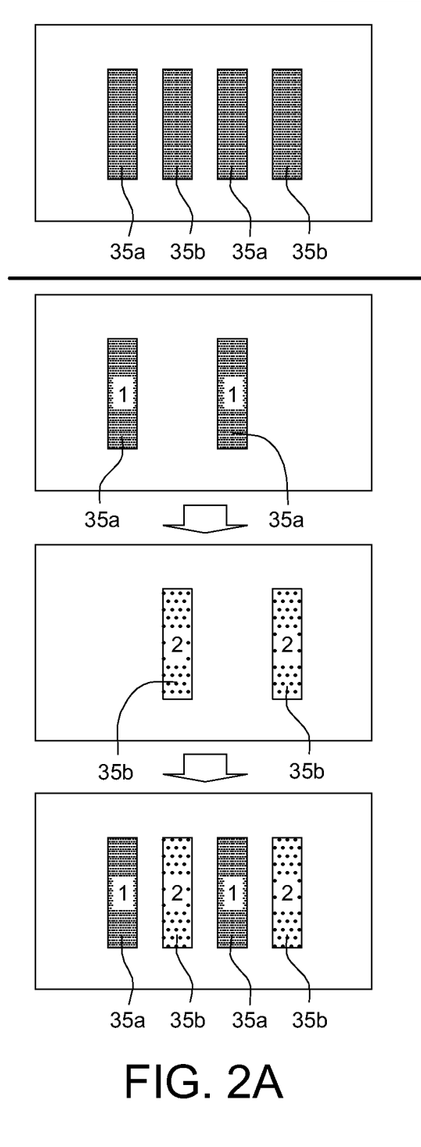
FIG. 2A is a simple drawing showing a method of patterning split.
Figure 2B:
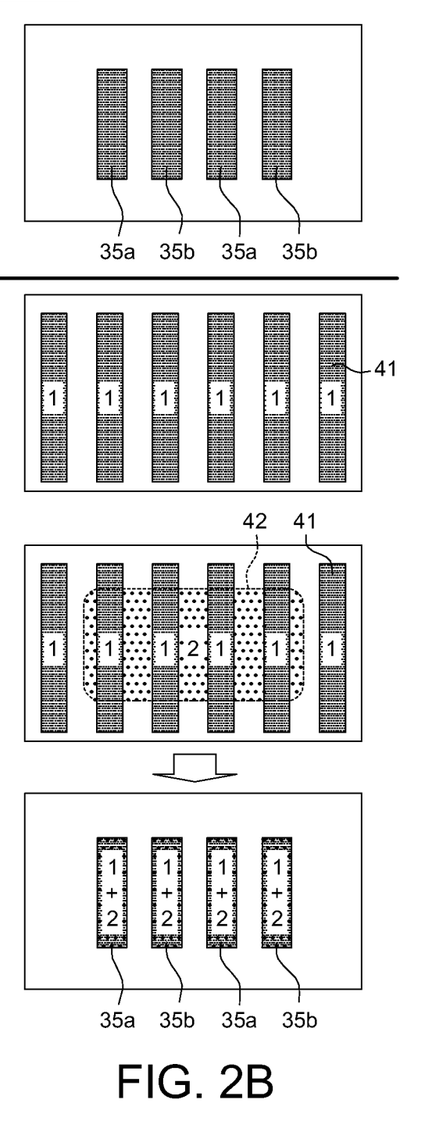
FIG. 2B is a simple drawing showing a method of slot cut.

Additionally, contact patterning (to form the openings 191) and/or M0 patterning (to form the first M0 opening and the second M0 opening) could be carried out by two different methods: (1) patterning split; and (2) slot cut. Take formation of the first M0 opening and the second M0 opening for example. FIG. 2A is a simple drawing showing a method of patterning split. FIG. 2B is a simple drawing showing a method of slot cut. In FIG. 2A and FIG. 2B, it is assumed that formation of two first M0 opening 35a and two second M0 opening 35b are required in a pattern design, which are arranged with an alternate order (as shown in the top pictures of FIG. 2A and FIG. 2B). In the method of patterning split (FIG. 2A), a first mask is used for transferring pattern to form the trenches 1 as the first M0 openings 35a, and a second mask is then used for transferring pattern to form the trenches 2 as the second M0 openings 35b, as shown in FIG. 2A. In the method of slot cut (FIG. 2B), a first mask is used for transferring pattern to form the trenches 1, which are plural fine-striped regions 41 related to the min-pitch and/or the dense areas of the substrate. The trenches 1 are neither the final pattern of the first M0 openings 35a nor the second M0 openings 35b. Then, a second mask may include a pattern 42 with opaque regions and/or transmissive regions for slot-cutting the unwanted portions of the trenches 1 correspondingly, thereby defining plural trenches (1+2) as the first M0 openings 35a and the second M0 openings 35b, respectively.

Second Embodiment

Figure 3:
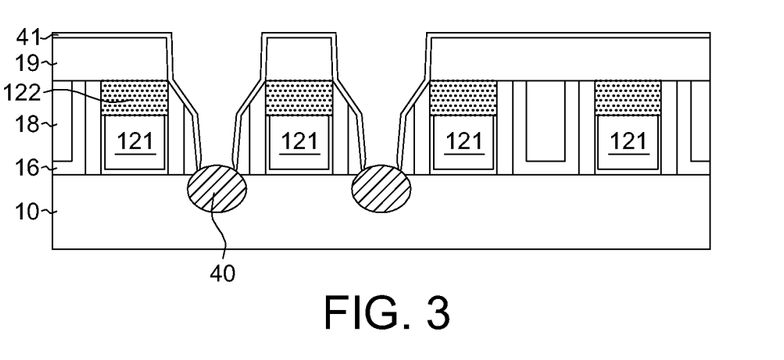
FIG. 3 shows formation of TiSi in the method for manufacturing a semiconductor device according to the second embodiment of the present disclosure.

The method for manufacturing a semiconductor device of the second embodiment is similar to that of the first embodiment. In the first embodiment, a Ni containing material such as NiSi 20 is taken for exemplifying the silicide of the device (FIG. 1C). In the second embodiment, a Ti containing material such as TiSi is taken for exemplifying the silicide of the device. FIG. 3 shows formation of TiSi in the method for manufacturing a semiconductor device according to the second embodiment of the present disclosure. The identical elements of FIG. 3 and FIG. 1A~FIG. 1H are designated with the same reference numerals, and explanation of identical or similar part is not repeated redundantly.

Similarly, a substrate 10 having plural gate structures such as metal gates 12 formed thereon is provided, wherein the adjacent metal gates 12 are separated by an insulation (as presented in FIG. 1A). A sacrificial layer 19 for capping the metal gates 12 and the insulation is formed, followed by the patterning steps to form the openings 191 (as presented in FIG. 1B). A treatment, such as a SiCoNi pre-clean treatment or an Ar pre-clean treatment, could be performed for cleaning the impurities (ex: native oxides).

Then, a silicide is then formed corresponding to the opening 191 at the substrate 10. In the second embodiment, a Ti containing layer such as a multi-layer of Ti/TiN is deposited on the substrate 10 within the opening 191, and then subjected to a thermal treatment to form a Ti containing portion such as the TiSi 40 at the substrate 10. The TiSi 40 has a surface convex to the substrate 10 as depicted in FIG. 3. There is no need to remove the unreacted Ti containing portion (such as Ti/TiN) since it could act as a barrier metal layer for the subsequent process. Thus, the unreacted Ti containing portion is remained in the opening 191 as a first barrier metal 41. Also, if Ti/TiN is deposited as the first barrier metal 41, the thickness of the bottom Ti is smaller than the thickness of the sidewall Ti, due to the loss of bottom Ti caused by the bottom Ti reacting with silicon of the substrate for forming TiSi.

In the second embodiment, the thermal treatment could be a rapid thermal process (RTP), which is performed to make a portion of the Ti containing layer (such as Ti/TiN) react with the substrate 10 (such as the silicon substrate) to form a Ti containing portion such as the TiSi 40. The rapid thermal process could be conducted at the temperature sufficient to conduct the Ti-silicide formation.

Other steps of forming the conductive contact 23' in the opening 191, comprising depositing a conductive layer (such as W) on the substrate 10 and filling the opening 191, followed by planarization (ex: CMP), are similar to the descriptions of the first embodiment, which are not redundantly repeated.

According to the aforementioned descriptions, the provided methods for manufacturing the semiconductor device of the embodiments adopt an extra sacrificial layer before silicide formation, thereby effectively preventing the possible damages to the components (such as the metal gate, the etch stop layer . . . etc.) of the device. The electrical properties of the device manufactured using the method of the present embodiments could be greatly improved consequently.

Other embodiments with different configurations of contacts, gates, (source and drain) are also applicable, which could be varied depending on the actual needs of the applications. It is, of course, noted that the configurations of FIG. 1A-FIG. 1H and FIG. 3 are depicted only for demonstration, not for limitation. It is known by people skilled in the art that the shapes or positional relationship of the constituting elements could be adjusted according to the requirements and/or manufacturing methods of the practical applications.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor device, comprising:
    a substrate with a gate layer formed thereon and silicides formed therein, and the gate layer comprising plural metal gates separated by an insulation, said silicides positioned between the metal gates;
    at least a conductive contact formed in the insulation between adjacent metal gates for electrically connecting the silicide; and
    a patterned dielectric layer formed on the metal gates, the insulation and the conductive contact, and the patterned dielectric layer at least having a first metal-0 (M0) opening exposing the conductive contact;
    wherein the conductive contact has a bottom area with a first diameter (CD1) for electrically connecting the silicide, and has a top area with a second diameter (CD2) for opening the insulation,
    wherein the first M0 opening has a bottom area with a third diameter (CD3) for exposing the conductive contact, and the third diameter (CD3) is smaller than the second diameter (CD2).

2. The semiconductor device according to claim 1, wherein the patterned dielectric layer further has a second M0 opening exposing the metal gate, and the semiconductor device further comprises a first M0 contact and a second M0 contact respectively formed in the first M0 opening and the second M0 opening.

3. The semiconductor device according to claim 1, wherein said silicide is NiSi with a concave surface to the substrate, or TiSi with a convex surface to the substrate.

4. The semiconductor device according to claim 1, wherein the conductive contact comprises:
    a first barrier metal deposited in an opening of the insulation as a liner; and
    a conductive material fills up the opening.

5. The semiconductor device according to claim 4, wherein the first barrier metal is a Ti/TiN multilayer.

6. The semiconductor device according to claim 1, wherein the insulation comprises:
    spacers, formed at sidewalls of the metal gates;
    a contact etch stop layer (CESL), formed on the substrate as an U-shape between the spacers; and
    a patterned ILD, filled in a space of the U-shaped CESL.

7. The semiconductor device according to claim 1, wherein the second diameter (CD2) is larger than the first diameter (CD1).

8. The semiconductor device according to claim 1, wherein a diameter of CD1 is in a range from 20 nm to 40 nm, a diameter of CD2 is in a range from 50 nm to 80 nm, and a diameter of CD3 is in a range from 30 nm to 50 nm.

* * * * *